United States Patent [19]
Yang

[11] Patent Number: 5,517,009
[45] Date of Patent: May 14, 1996

[54] STRUCTURE OF KEYBOARD

[75] Inventor: Fu-Li Yang, Taipei, Taiwan

[73] Assignee: Chicony Electronics Co., Ltd., Taipei, Taiwan

[21] Appl. No.: 274,697

[22] Filed: Jul. 14, 1994

[51] Int. Cl.$^6$ .............................. G06C 7/02; H01H 9/26; H05K 5/00

[52] U.S. Cl. ..................... 235/145 R; 200/5 A; 200/511; 361/680

[58] Field of Search ............................... 285/145 R, 146; 200/511, 5 A; 361/679, 680

[56] References Cited

U.S. PATENT DOCUMENTS 4,818,828  4/1989  Curley et al. ................. 235/145 R Primary Examiner—Cassandra Spyrou

[57] ABSTRACT

A keyboard for a computer includes a rubber pad having conductive rubber cones and a recessed portion, a key unit having keys respectively disposed above the rubber cones, an upper silver grating and a bottom silver grating and retained between a frame and the rubber pad and having projecting strips with respective electric contacts projecting into the recessed portion and in contact with a circuit board mounted within the recessed portion.

2 Claims, 3 Drawing Sheets

5,517,009

STRUCTURE OF KEYBOARD

BACKGROUND OF THE INVENTION

The present invention relates to computer keyboards, and relates more particularly to the circuit arrangement of a computer keyboard.

A computer or computer system is generally equipped with a keyboard for signal input. FIG. 1 shows a structure of computer keyboard, which comprises a key unit A, a circuit board B, a rubber pad C, a silver grating D, a frame E, and a bottom shell F. The silver grating D is mounted on the frame E and covered by the rubber pad C, having circuits and electric contacts. The rubber pad C has conductive rubber cones C1 respectively disposed above the contacts of the silver grating D. The silver grating D further comprises a projecting strip D1 having contacts respectively connected to the circuits of the silver grating D. The contacts of the projecting strip D1 are respectively connected to respective contacts on the circuit board B. When one key is depressed, the corresponding rubber cone C1 is compressed to touch the corresponding contact on the silver grating D, causing the circuit board B to provide a corresponding signal to the computer for further processing. The connection between the contacts on the circuit board and the contacts on the projecting strip D1 is made by a connector B1, which is mounted on the circuit board B. The arrangement of the connector B1 greatly increases the cost of the keyboard. Furthermore, the silver grating D may displace easily because it is supported on the frame E.

SUMMARY OF THE INVENTION

The present invention has been accomplished to provide a computer keyboard which eliminates the aforesaid drawbacks. It is therefore an object of the present invention to provide a computer keyboard which is inexpensive to manufacture. It is another object of the present invention to provide a computer keyboard which is stable and durable in use.

According to one aspect of the present invention, the keyboard comprises a rubber pad having conductive rubber cones and a recessed portion, a key unit having keys respectively disposed above the rubber cones, an upper silver grating and a bottom silver grating vertically spaced by a signal isolating board and retained between a frame and a rubber pad and having a respective projecting strip with respective electric contacts projecting into the recessed portion, and a circuit board mounted within the recessed portion to hold down the projecting strips of the upper and bottom silver gratings and having electric contacts at the bottom respectively disposed in contact with respective electric contacts on the projecting strips of the upper and bottom silver gratings. According to another aspect of the present invention, a rubber cushion is mounted on the frame to support the projecting strips of the silver gratings in place, and therefore the upper and bottom silver gratings do not displace.

DETAILED DESCRIPTION OF THE PREFERRED EMBODIMENTS

Figure 1:
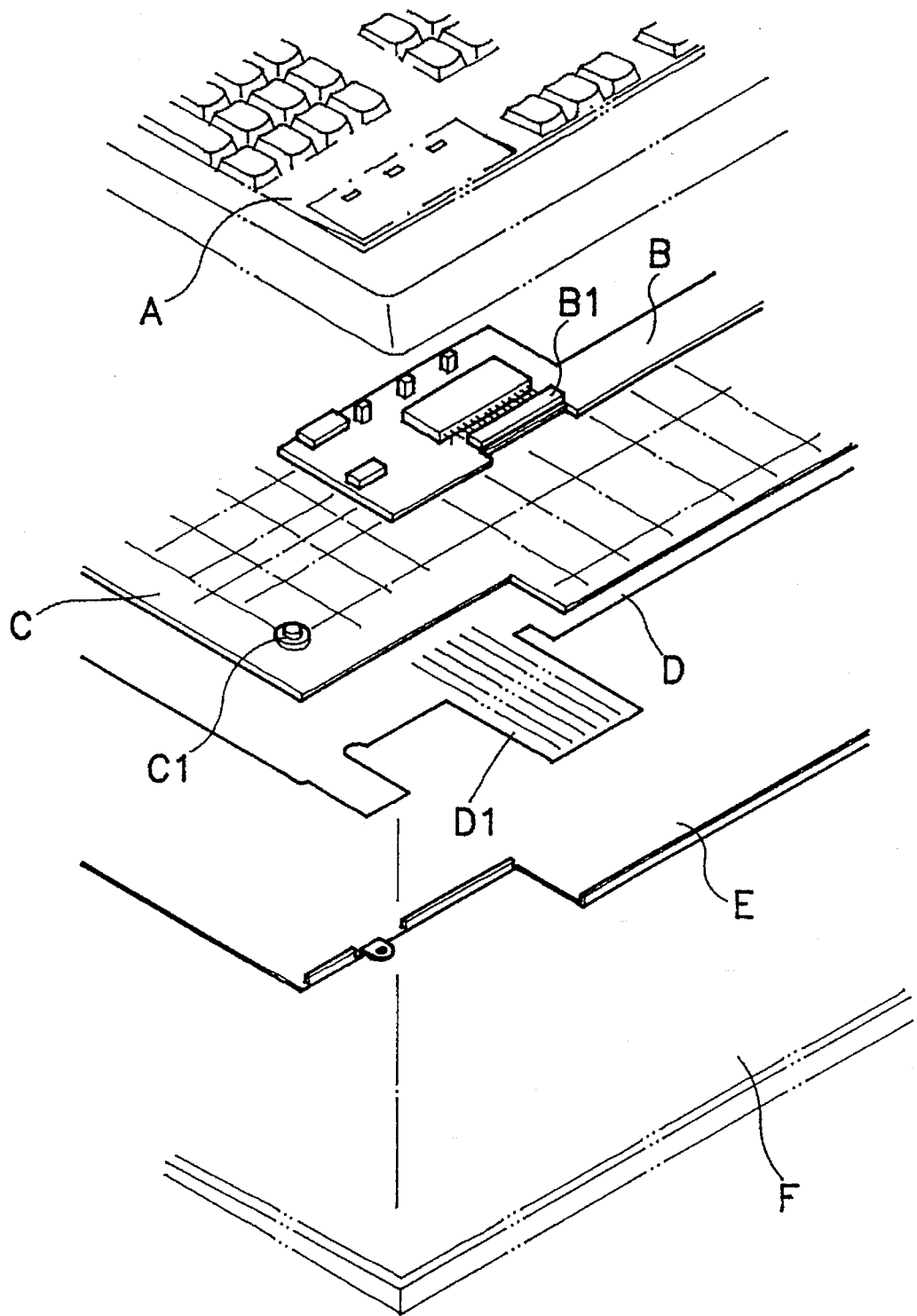
FIG. 1 is an exploded view of a computer keyboard according to the prior art.
Figure 2:
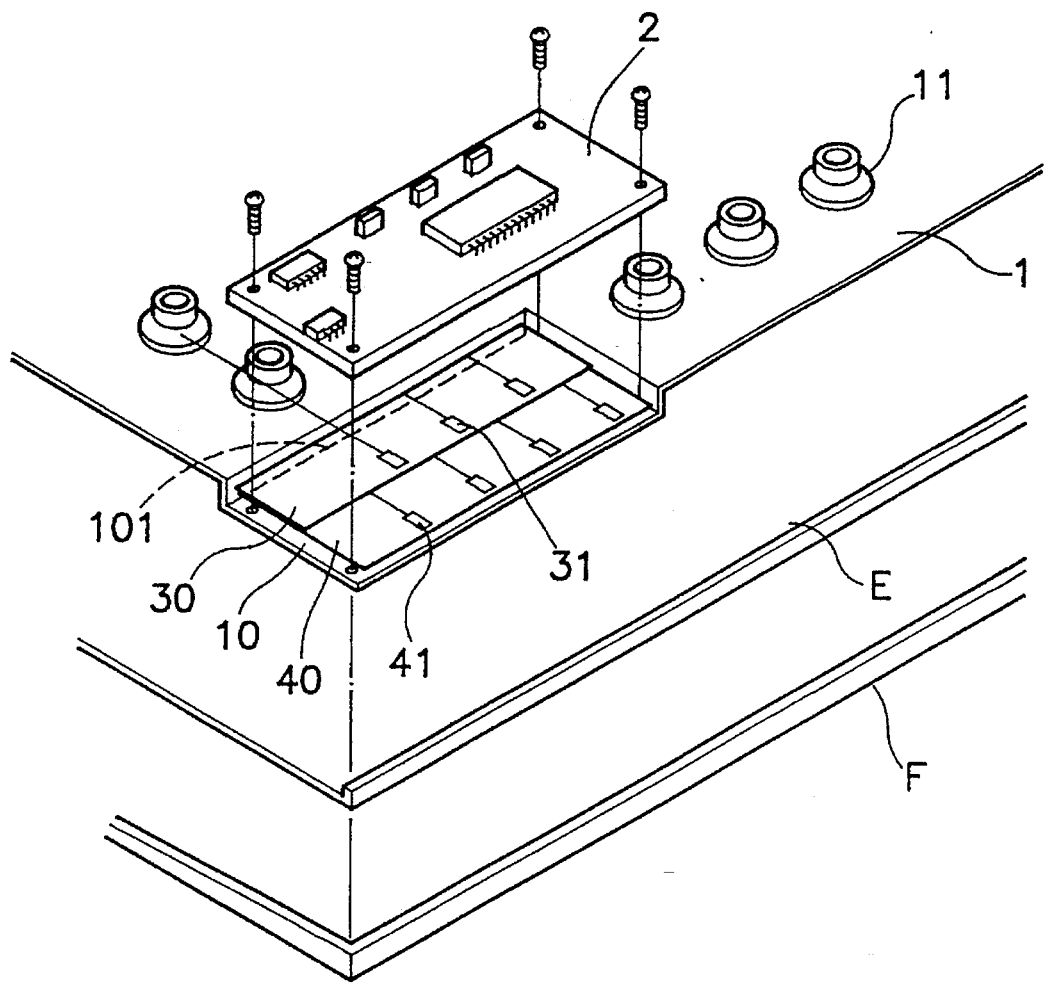
FIG. 2 is an exploded view of a computer keyboard according to the present invention.
Figure 3:
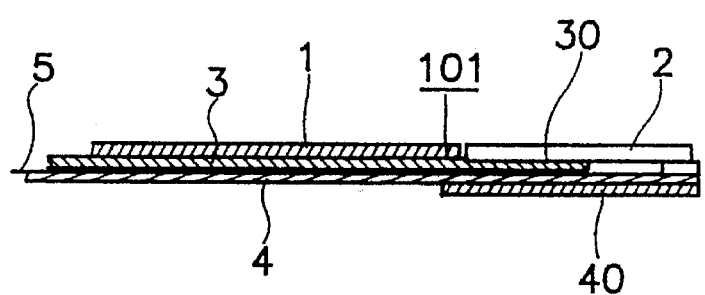
FIG. 3 is a sectional view of the computer keyboard shown in FIG. 2.

Referring to FIG. 2, a computer keyboard is shown comprised of a rubber pad 1, a circuit board 2, an upper silver grating 3, a bottom silver grating 4, a signal isolating board 5, a frame E, and a bottom shell F. The upper and bottom silver gratings 3 and 4 are disposed between the frame E and the rubber pad 1, having respective circuits and contacts. The contacts of the upper and bottom silver gratings 3 and 4 are respectively disposed in line with respective conductive rubber cones 11 on the rubber pad 1. The upper and bottom silver gratings 3 and 4 have a respective projecting strip 30 or 40 with respective contacts 31 or 41 respectively electrically connected to the circuit board 2. When either key (not shown) is depressed, the corresponding rubber cone 11 is forced to contact the respective contacts 31 and 41 on the upper and bottom silver gratings 3 and 4, causing the circuit board 2 triggered to produce a corresponding signal to the computer for display. The rubber pad 11 has a recessed portion 10 and an elongated slot 101 along an inner side of the recessed portion 10. The upper silver grating 3 and the bottom silver grating 4 are arranged in a stack and insulated from each other by the signal isolating board 5. The projecting strips 30 and 40 of the upper and bottom silver gratings 3 and 4 are respectively inserted through the elongated slots 101 and overlapped within the recessed portion 10. However, the contacts 31 on the upper silver grating 3 and the contacts 41 on the bottom silver grating 4 are so made that they are separated from one another when the projecting strips 30 and 40 are overlapped within the recessed portion 10. The circuit board 2 has contacts (not shown) at the bottom. When the circuit board 2 is fixedly mounted within the recessed portion 10 of the rubber pad 1, the contacts of the circuit board 2 are respectively disposed in contact with the contacts 31 and 41 of the upper and bottom silver gratings 3 and 4. Because the upper and bottom silver gratings 3 and 4 are covered by the rubber pad 1 (see FIG. 3), they are firmly retained in place when the circuit board 2 is fixedly fastened to the rubber pad 1.

Figure 4:
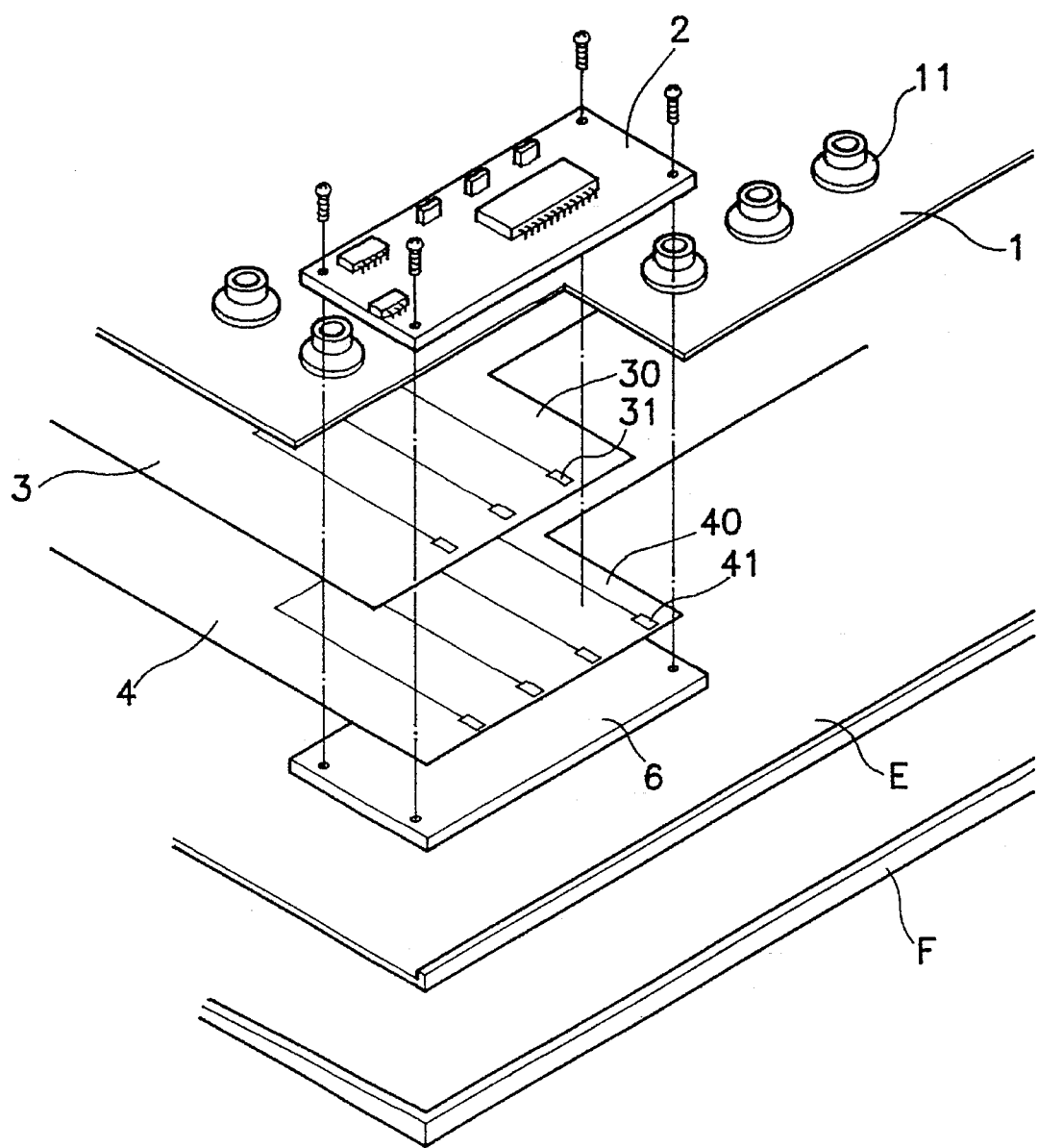
FIG. 4 is an exploded view of an alternate form of the present invention.

FIG. 4 illustrates an alternate form of the present invention which includes a small rubber cushion 6 mounted on the frame E to support the overlapped projecting strips 30 and 40 of the upper and bottom silver gratings 3 and 4. In this alternate form, the rubber pad 1 has a notch (instead of the recessed portion 10) into which the overlapped projecting strips 30 and 40 project. The circuit board 2 is covered over the projecting strips 30 and 40 and fixedly fastened to the rubber cushion 6.

What is claimed is:

1. A keyboard for a computer, comprising a rubber pad supported on a frame above a bottom shell and having a plurality of conductive rubber cones, a circuit board, a silver grating assembly retained between said rubber pad and said frame, a key unit covered over said rubber pad and having a plurality of keys respectively disposed above said rubber cones and alternatively depressed to trigger said circuit board through said silver grating assembly causing said circuit board to produce a respective signal to the computer, wherein:

said rubber pad has a recessed portion and an elongated slot along one side of said recessed portion; said silver grating assembly comprises a bottom silver grating, an upper silver grating covered on said bottom silver grating, and a signal isolating board covered between said bottom and upper silver gratings, said bottom silver grating having a projecting strip inserted through said elongated slot and disposed within said recessed portion, said upper silver grating having a projecting strip inserted through said elongated slot and covering part of the projecting strip of said bottom silver grating, the projecting strips of said bottom and upper silver gratings having respective electric contacts spaced at different locations; said circuit board is fixedly mounted within said recessed portion and covered over the projecting strips of said upper and bottom silver gratings, having a plurality of electric contacts at the bottom respectively disposed in contact with the electric contacts of the projecting strips of said upper and bottom silver gratings.

2. A keyboard for a computer, comprising a rubber pad supported on a frame above a bottom shell and having a plurality of conductive rubber cones, a circuit board, a silver grating assembly retained between said rubber pad and said frame, a key unit covered over said rubber pad and having a plurality of keys respectively disposed above said rubber cones and alternatively depressed to trigger said circuit board through said silver grating assembly causing said circuit board to produce a respective signal to the computer wherein:

said rubber pad has a notched portion; said silver grating assembly comprises a bottom silver grating, an upper silver grating covered on said bottom silver grating, and a signal isolating board covered between said bottom and upper silver gratings, said bottom silver grating having a projecting strip disposed within said notched portion, said upper silver grating having a projecting strip disposed within said notched portion and covering part of the projecting strip of said bottom silver grating, the projecting strips of said bottom and upper silver gratings having respective electric contacts spaced at different locations; said circuit board is fixedly mounted within said notched portion and covered over the projecting strips of said upper and bottom silver gratings, having a plurality of electric contacts at the bottom respectively disposed in contact with the electric contacts of the projecting strips of said upper and bottom silver gratings; and a rubber cushion is mounted on said frame to support the projecting strips of said upper and bottom silver gratings in place.

\* \* \* \* \*